United States Patent [19]
Yu

[11] Patent Number: 5,945,714
[45] Date of Patent: Aug. 31, 1999

[54] LATERAL SILICON-CONTROLLED RECTIFIER FOR ELECTROSTATIC DISCHARGE PROTECTION

[75] Inventor: Ta-Lee Yu, Hsinchu Hsien, Taiwan

[73] Assignee: Winbond Electronics Corporation, Hsinchu, Taiwan

[21] Appl. No.: 09/055,616

[22] Filed: Apr. 6, 1998

[30] Foreign Application Priority Data

Apr. 3, 1997 [TW] Taiwan ................................. 87103159

[51] Int. Cl.⁶ ............................. H01L 29/74; H01L 23/62
[52] U.S. Cl. ......................... 257/355; 257/356; 257/173
[58] Field of Search ..................................... 257/355, 356, 257/357, 358, 359, 360, 361, 363, 173, 174

[56] References Cited

U.S. PATENT DOCUMENTS 5,012,317   4/1991   Rountre ................................... 257/355

*Primary Examiner*—Wael M. Fahmy
*Attorney, Agent, or Firm*—Fish & Richardson P.C.

[57] ABSTRACT

A lateral silicon-controlled rectifier, which comprises a semiconductor layer of a first conductivity type, a floating semiconductor layer of a second conductivity type, a first doped region of the first conductivity type, a first doped region of the second conductivity type, and a second doped region of the first conductivity type, is disclosed. The floating semiconductor layer of a second conductivity type is in electrical contact with the semiconductor layer of a first conductivity type to establish a junction. The first doped region of the first conductivity type is formed in the semiconductor layer of a second conductivity type and coupled to a first node. Both the first doped region of the second conductivity type and the second doped region of the first conductivity type are formed in the semiconductor layer of a first conductivity type and coupled to a second node. When electrostatic discharge stress occurs between the first node and second node, the junction will enter breakdown so as to trigger the lateral silicon-controlled rectifier and thus conduct a discharge current, thereby bypassing the electrostatic discharge stress.

9 Claims, 3 Drawing Sheets

LATERAL SILICON-CONTROLLED RECTIFIER FOR ELECTROSTATIC DISCHARGE PROTECTION

BACKGROUND OF THE INVENTION

1. Field of the Invention

The present invention generally relates to electrostatic discharge protection techniques for semiconductor integrated circuitry, and, more specifically, relates to a lateral silicon-controlled rectifier for electrostatic discharge protection.

2. Description of the Prior Art

Electrostatic discharge, ESD hereinafter, is a common phenomenon that occurs during handling of semiconductor integrated circuit ("IC") devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely hamper its operation.

However, sub-micron CMOS IC have become increasingly vulnerable to ESD damage due to advanced processes, such as the use of a lightly-doped drain ("LDD") structure and clad silicide diffusions. Therefore, lateral silicon-controlled rectifiers (LSCRs) have been proposed, for example, in U.S. Pat. No. 5,012,317, as ESD protection circuits for facilitating ESD protection. The cross-sectional view of a conventional lateral silicon-controlled rectifier fabricated onto a semiconductor substrate is illustrated in FIG. 1.

As shown in FIG. 1, the silicon-controlled rectifier is fabricated on a P-type silicon substrate 10 in which an N-well region 11 is formed. A P-type doped region 12 and an N-type doped region 13 are formed within the extent of the N-well region 11 and spaced apart from each other, while an N-type doped region 14 and a P-type doped region 15 are formed within the extent of the P-type silicon substrate 10 and spaced apart from each other. The P-type doped region 12 and the N-type doped region 13 are connected together to an IC pad 1. The IC pad 1 is electrically coupled to an internal circuit 2, which is vulnerable to ESD damage and should be protected by the lateral silicon-controlled rectifier. In addition, the N- type doped region 14 and the P-type doped region 15 are connected together to a potential node $V_{SS}$, which is generally coupled to grounding potential under normal operation.

Accordingly, the P-type doped region 12, the N-well region 11, and the P-type silicon substrate 10 serve as the emitter, base, and collector, respectively, of a PNP bipolar junction transistor 20; the N-well region 11, the P-type silicon substrate 10, and the N-type doped region 14 serve as the collector, base, and emitter, respectively, of an NPN bipolar junction transistor 21. Referring to FIG. 2, the equivalent circuit diagram of the conventional lateral silicon-controlled rectifier shown in FIG. 1 is schematically depicted. In FIG. 2, resistors 22 and 23 stand for the spreading resistance of the N-well region 11 and the P-type silicon substrate 10, respectively.

When ESD stress occurs at the IC pad 1, the P/N junction between the N-well region 11 and the P-type silicon substrate 10 sustains breakdown so as to forward bias the P/N junction of the P-type silicon substrate 10 and the N-type doped region 14. Therefore, the lateral silicon-controlled rectifier composed of the PNP transistor 20, NPN transistor 21 and the resistors 22 and 23 is triggered to conduct the resulting ESD current and thus bypass the ESD stress so as to protect the internal circuit 2 from ESD damage.

As mentioned above, triggering the conventional lateral silicon-controlled rectifier to turn on and thus bypass the ESD stress occurring at the IC pad 1 heavily relies on the junction breakdown between the N-well region 11 and the P-type silicon substrate 10. However, both N-well region 11 and the P-type silicon substrate 10 have doping concentrations so low that the trigger voltage of the lateral silicon-controlled rectifier is roughly 30V or more. For example, with CMOS fabrication technology of 0.6~0.8 $\mu$m, gate oxides of about 150~200 Å in thickness, deployed in the internal circuit 2, may be damaged at voltages lower than the trigger voltage of the conventional lateral silicon-controlled rectifier.

For the foregoing reason, there is a need for a lateral silicon-controlled rectifier provided with a lower trigger voltage so as protect the internal circuit from ESD damage.

SUMMARY OF THE INVENTION

Therefore, an object of the present invention is to provide a lateral silicon-controlled rectifier having a trigger voltage lower than voltages at which an internal circuit may be damaged.

Another object of the present invention is to provide a lateral silicon-controlled rectifier consuming less layout area.

The present invention achieves the above-indicated objects by providing a lateral silicon-controlled rectifier, which comprises a semiconductor layer of a first conductivity type, a floating semiconductor layer of a second conductivity type, a first doped region of the first conductivity type, a first doped region of the second conductivity type, and a second doped region of the first conductivity type. The floating semiconductor layer of a second conductivity type is in electrical contact with the semiconductor layer of a first conductivity type to establish a junction. The first doped region of the first conductivity type is formed in the semiconductor layer of a second conductivity type and coupled to a first node. Both of the first doped region of the second conductivity type and the second doped region of the first conductivity type are formed in the semiconductor layer of a first conductivity type and coupled to a second node. When electrostatic discharge stress occurs between the first node and second node, the junction will enter breakdown so as to trigger the lateral silicon-controlled rectifier and thus conduct a discharge current to bypass the electrostatic discharge stress.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, a lateral silicon-controlled rectifier comprises an open-base PNP bipolar junction transistor and an NPN bipolar transistor so as to lower the voltage at which the junction constituted by an N-well region and a P-type substrate enters breakdown. Accordingly, the lateral silicon-controlled rectifier of the present invention has a trigger voltage lower than the voltages at which an internal circuit may be damaged.

Figure 3:
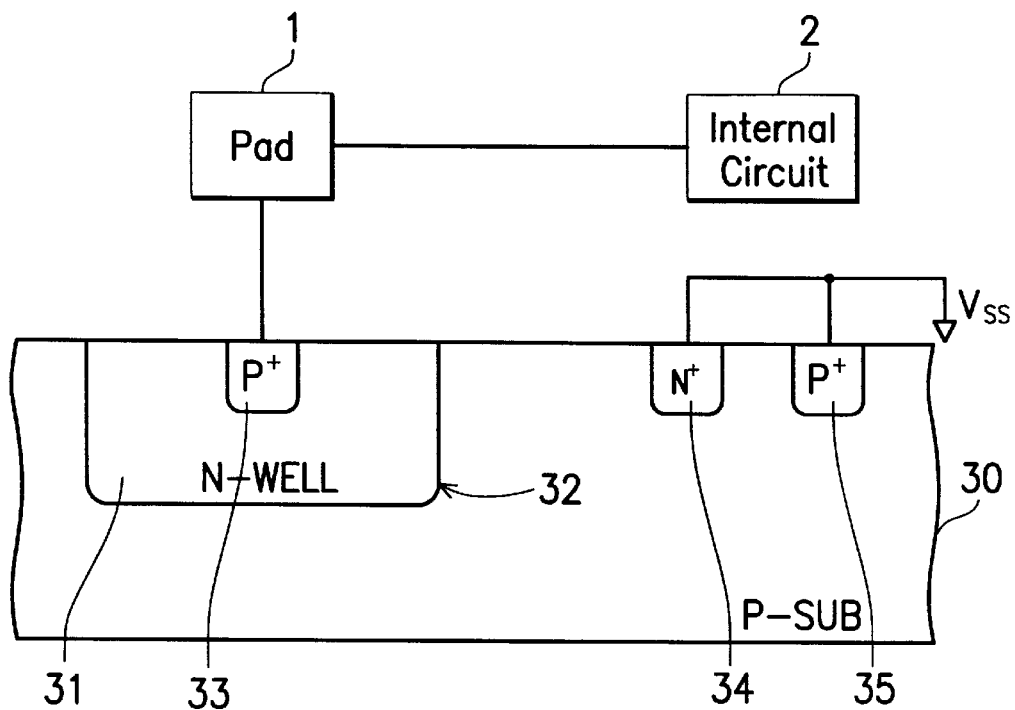
FIG. 3 depicts a cross-sectional view of one preferred embodiment of the present invention fabricated onto a semiconductor substrate.

Referring to FIG. 3, a lateral silicon-controlled rectifier according to one preferred embodiment of the present invention fabricated onto a semiconductor substrate is illustrated in a cross-sectional view. In this embodiment, the lateral silicon-controlled rectifier is generally fabricated onto a P-type semiconductor layer 30 in which an N-type semiconductor layer 31 is formed to establish a P/N junction 32 therebetween. Preferably, the P-type semiconductor 30 can be a P-type silicon substrate, and the N-type semiconductor 31 can be a well region formed in the P-type substrate by diffusion processing, accordingly. Note that a first N-type doped region 34 and a second P-type doped region 35 are formed within the extent of the P-type semiconductor layer 30 and spaced apart from each other, but only a first P-type doped region 33 is formed in the N-type semiconductor layer 31. The first P-type doped region 33 is electrically connected to the IC pad 1. The IC pad 1 is electrically coupled to the internal circuit 2 which is vulnerable to ESD damage and should be protected by the lateral silicon-controlled rectifier of the present invention. Moreover, the first N-type doped region 34 and the second P-type doped region 35 are connected together to a potential node $V_{SS}$, which is generally coupled to ground under normal operation.

Figure 4:
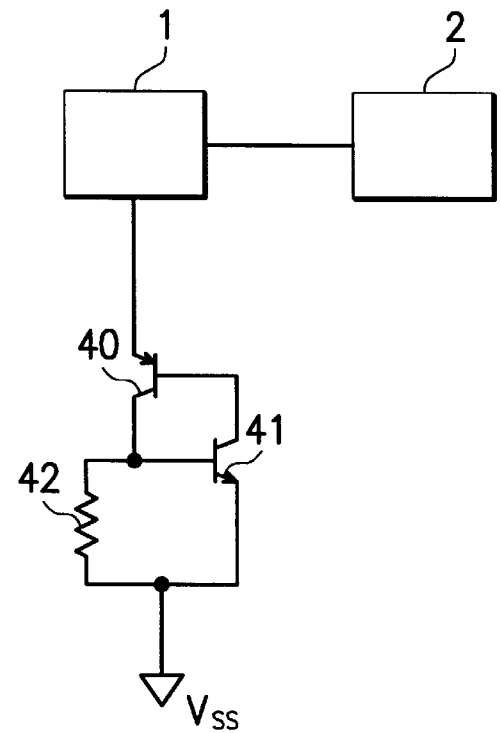
FIG. 4 schematically depicts an equivalent circuit diagram of FIG. 3.

Accordingly, the first P-type doped region 33, the N-type semiconductor layer 31, and the P-type semiconductor layer 30 serve as the emitter, base, and collector, respectively, of a PNP bipolar junction transistor 40. The N-type semiconductor layer 31, the P-type semiconductor layer 30, and the first N-type doped region 34 serve as the collector, base, and emitter, respectively, of an NPN bipolar junction transistor 41. Referring to FIG. 4, the equivalent circuit diagram of the lateral silicon-controlled rectifier according to one preferred embodiment of the present invention as shown in FIG. 3 is schematically depicted. In FIG. 4, a resistor 42 stands for the spreading resistance of the P-type semiconductor layer 30.

When ESD stress occurs at the IC pad 1, the P/N junction 32 between the N-type semiconductor layer 31 and the P-type semiconductor layer 30 enters breakdown so as to forward bias the P/N junction of the P-type semiconductor layer 30 and the first N-type doped region 34. Therefore, the lateral silicon-controlled rectifier according to the present invention is triggered to conduct the resulting ESD current and thus bypass the ESD stress, thereby protecting the internal circuit 2 from ESD damage.

Figure 1:
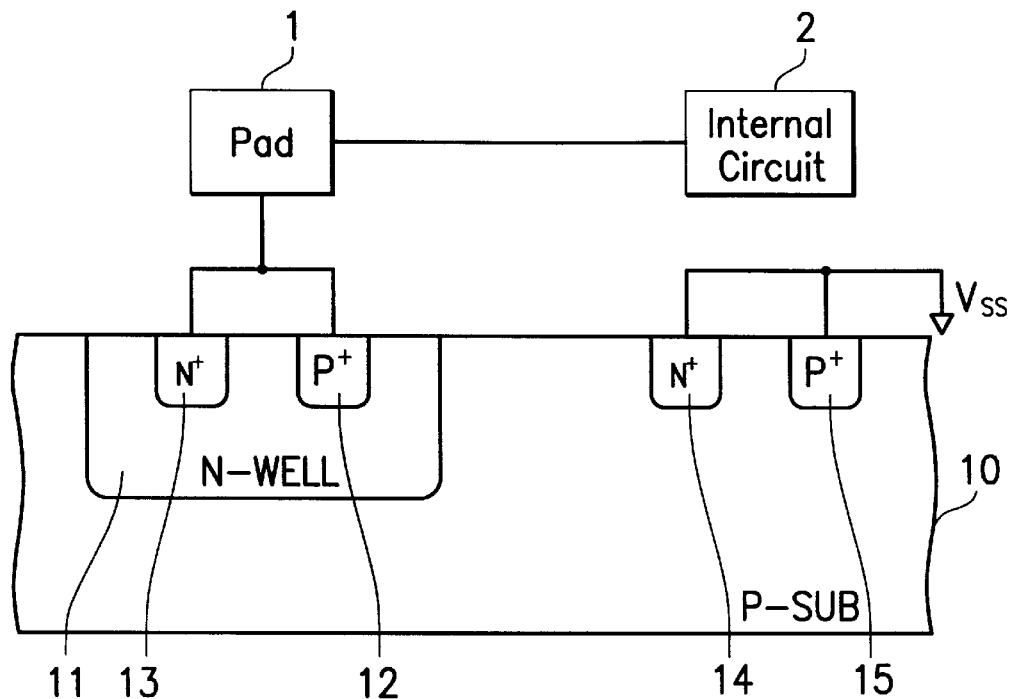
FIG. 1 depicts a cross-sectional view of a conventional lateral silicon-controlled rectifier fabricated onto a semiconductor substrate.
Figure 2:
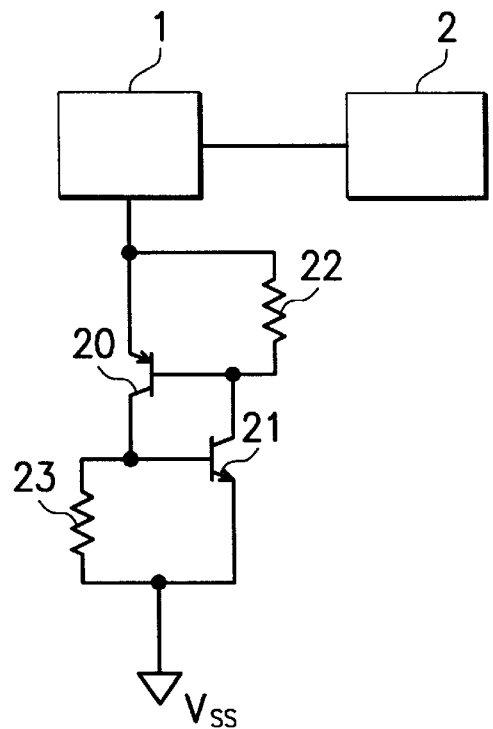
FIG. 2 schematically depicts an equivalent circuit diagram of the conventional lateral silicon-controlled rectifier as shown in FIG. 1.

Since only the first P-type doped region 33 is formed in the N-type semiconductor layer 31 and no contact region provided therein (as compared with the N-type region 13 shown in FIG. 1), the N-type semiconductor layer 31 is thus floating. In other words, the PNP bipolar junction transistor 40 is configured with an open base as shown in FIG. 4. Consequently, although the trigger voltage of the lateral silicon-controlled rectifier of the present invention also heavily relies upon the junction breakdown between the N-type semiconductor layer 31 and the P-type semiconductor layer 30, the floating N-type semiconductor layer 31 can decrease the breakdown voltage, based on the expression disclosed in B. J. Baliga, "POWER SEMICONDUCTOR DEVICES," Chapter 5, Page 236, as follows:

$$BV_{CEO} = BV_{CBO} / \sqrt[n]{\beta}$$

In a word, the lateral silicon-controlled rectifier in accordance with the present invention has a lowered trigger voltage of about 8~15V.

As to the breakdown voltage of gate oxides, 15~20V, the lateral silicon-controlled rectifier of the present invention can be triggered before the gate oxides enters breakdown. During the ESD event, the lateral silicon-controlled rectifier of the present invention conducts a discharge current to bypass the ESD stress, and the voltage at the IC pad 1 can be clamped to a holding voltage. Furthermore, as compared with the conventional one, the lateral silicon-controlled rectifier of the present invention has a lower holding voltage as well as a lower trigger voltage because of the floating N-type semiconductor layer 13. In addition, the fact that there is no contact region positioned between the IC pad 1 and the N-type semiconductor layer 31 reduces the required layout area.

Figure 5:
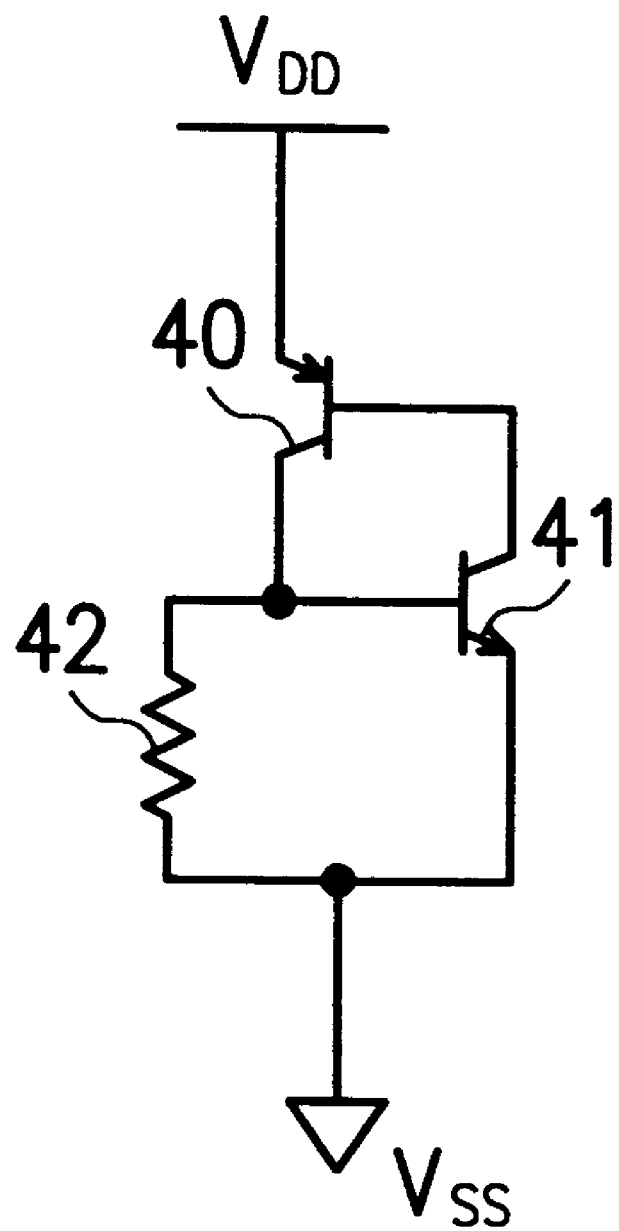
FIG. 5 schematically depicts an equivalent circuit diagram of another preferred embodiment.

Referring to FIG. 5, the equivalent circuit diagram of further another preferred embodiment of the present invention with the first P-type doped region 33 electrically connected to $V_{DD}$ node instead of being connected to the IC pad 1, is schematically depicted. Under normal operation 5V or 3.3V is applied to the $V_{DD}$ node.

In conclusion, the lateral silicon-controlled rectifier in accordance with the present invention comprises the open-base PNP bipolar junction transistor and the NPN bipolar transistor so as to lower the voltage at which the junction 32 constituted by an floating N-type semiconductor 31 and the P-type semiconductor layer 30 enters breakdown. Accordingly, the lateral silicon-controlled rectifier of the present invention has a trigger voltage that is lower than the voltages at which the internal circuit 2 may be damaged, and thus protects it from ESD damage.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. A lateral silicon-controlled rectifier, comprising:
   a semiconductor layer of a first conductivity type;
   a floating semiconductor layer of a second conductivity type in contact with said semiconductor layer of a first conductivity type to establish a junction therebetween;
   a first doped region of the first conductivity type formed in said semiconductor layer of a second conductivity type and coupled to a first node;

a first doped region of the second conductivity type formed in said semiconductor layer of a first conductivity type and coupled to a second node; and a second doped region of the first conductivity type formed in said semiconductor layer of a first conductivity type and coupled to said second node;

wherein said junction enters breakdown to trigger said lateral silicon-controlled rectifier to conduct a discharge current when electrostatic discharge stress occurs between said first node and said second node.

2. The lateral silicon-controlled rectifier as claimed in claim 1, wherein the first conductivity type is P-type, and the second conductivity type is N-type.

3. The lateral silicon-controlled rectifier as claimed in claim 2, wherein said first node is connected to an integrated circuit pad.

4. The lateral silicon-controlled rectifier as claimed in claim 3, wherein said second node is connected to a relatively-low potential under normal operation.

5. The lateral silicon-controlled rectifier as claimed in claim 2, wherein said first node is connected to a relatively-high potential under normal operation.

6. The lateral silicon-controlled rectifier as claimed in claim 5, wherein said second node is connected to a relatively-low potential under normal operation.

7. A lateral silicon-controlled rectifier, comprising:

a P-type semiconductor layer;

a floating N-type semiconductor layer in contact with said P-type semiconductor layer to establish a junction therebetween;

a first P-type doped region formed in said N-type semiconductor layer and connected to a first node;

a first N-type doped region formed in said P-type semiconductor layer and connected to a second node; and a second P-type doped region formed in said P-type semiconductor layer and connected to said second node;

wherein said junction enters breakdown to trigger said lateral silicon-controlled rectifier to conduct a discharge current when electrostatic discharge stress occurs between said first node and said second node.

8. The lateral silicon-controlled rectifier as claimed in claim 7, wherein said first node and second node are connected to an integrated circuit pad and a relatively-low potential, respectively.

9. The lateral silicon-controlled rectifier as claimed in claim 7, wherein said first node and second node are connected to a relatively-high potential and a relatively-low potential, respectively.

* * * * *